United States Patent
Ominami et al.

(10) Patent No.: US 7,838,828 B2
(45) Date of Patent: Nov. 23, 2010

(54) SEMICONDUCTOR DEVICE INSPECTION APPARATUS

(75) Inventors: Yusuke Ominami, Hitachinaka (JP); Yasuhiro Gunji, Hitachiota (JP); Yoshiyuki Shichida, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 373 days.

(21) Appl. No.: 12/132,361

(22) Filed: Jun. 3, 2008

(65) Prior Publication Data

US 2008/0308725 A1 Dec. 18, 2008

(30) Foreign Application Priority Data

Jun. 13, 2007 (JP) .............................. 2007-156660

(51) Int. Cl.
*H01J 37/153* (2006.01)
*H01J 37/073* (2006.01)
*G01N 23/00* (2006.01)

(52) U.S. Cl. .................. 250/306; 250/310; 250/397; 250/492.2; 250/492.3

(58) Field of Classification Search ................ 250/306, 250/310, 397, 492.2, 492.3; 438/12
See application file for complete search history.

(56) References Cited

U.S. PATENT DOCUMENTS

| | | | | |
|---|---|---|---|---|
| 5,384,463 A | * | 1/1995 | Honjo et al. | 250/398 |
| 6,583,414 B2 | | 6/2003 | Nozoe et al. | |
| 7,181,060 B2 | * | 2/2007 | Honda et al. | 382/151 |
| 7,230,723 B2 | | 6/2007 | Yamaguchi et al. | |
| 7,285,777 B2 | * | 10/2007 | Kawada et al. | 250/307 |

FOREIGN PATENT DOCUMENTS

JP 2002-124555 4/2002

* cited by examiner

*Primary Examiner*—Nikita Wells
(74) *Attorney, Agent, or Firm*—McDermott Will & Emery LLP

(57) ABSTRACT

A semiconductor device inspection apparatus having a noise subtraction function includes an electron gun, a stage for holding a sample, a main detector for detecting a signal discharged from the sample, and at least one or more sub detector for detecting noise generated from the sample or apparatus so that there can be obtained an image in which the noise caused by discharge generated on the sample or in the apparatus is removed from the signal. The noise subtraction function subtracts the noise detected by the sub detector from the signal detected by the main detector to remove or reduce the noise from the signal.

5 Claims, 3 Drawing Sheets

SEMICONDUCTOR DEVICE INSPECTION APPARATUS

FIELD OF THE INVENTION

The present invention relates to a semiconductor device inspection apparatus and more particularly to a semiconductor device inspection apparatus for inspecting a defect existing in patterns formed on a semiconductor wafer.

BACKGROUND OF THE INVENTION

Semiconductor devices such as memories or microcomputers used for computers are manufactured by repeating the steps for transferring, using the exposure, lithography and etching processes, a pattern of circuits formed on a photomask. During the manufacturing process of semiconductor devices, the quality as a result of the lithography, etching and the other processes, and the presence of defects such as generation of foreign matters greatly affects the manufacturing yield of the semiconductor devices. Accordingly, to detect the presence of abnormality or defects at an early stage or even before they occur, an inspection of the patterns on the semiconductor wafer is performed upon termination of each manufacturing process. As one example of a method for inspecting defects existing in a pattern on the semiconductor wafer, a method and an apparatus for inspecting patterns using an electron-beam image have been put to practical use.

U.S. Pat. No. 6,583,414 B2 discloses an inspection apparatus including a section for irradiating and scanning an electron beam to a surface of a substrate where a circuit pattern is formed; a detecting section for detecting signals secondarily generated from the surface of the substrate; a section for forming an image on a display device from the signals detected by the detecting section; and a section for automatically recognizing information about foreign matters and defects based on figure, roughness and voltage contrast of the surface of the substrate from the image. These inspection apparatuses must obtain an image with a higher SN ratio at an extremely high speed in order to perform a high-throughput and high-accuracy inspection. To satisfy such a requirement, it is required to keep a higher SN ratio by ensuring the necessary number of electrons to be irradiated to the circuit pattern using a large-current electron beam which is equal to or more than 1000 times (100 nA or more) that used for a usual scanning electron microscope (SEM). Further, it is essential to highly efficiently detect secondary electrons produced from a substrate and reflection electrons reflected therefrom at a higher speed.

During the detection of defects, when the originally-unintended defects are detected by the noise caused by various reasons, it is expected that there is caused deterioration not only in the classification accuracy of the automatic defect recognition but also in the inspection performance itself of the inspection device. Therefore, as disclosed in Japanese Patent Application Laid Open No. 2002-124555, there is used a method in which defects are detected and then automatically classified to thereby determine whether the defects include a real defect or false information. Further, as disclosed in U.S. Pat. No. 7,230,723 B2, there is also used a method in which noise randomly generated is statistically indexed and reduction in the noise is performed by the image processing.

SUMMARY OF THE INVENTION

However, it is not enough to perform an automatic defect classification method or statistical image processing disclosed in Japanese Patent Application Laid Open No. 2002-124555 or U.S. Pat. No. 7,230,723 B2 as described above. For example, when the discharge is generated in a minute region due to charging caused by a large-current electron beam irradiated to a sample, a large number of electrons or electromagnetic waves are generated from the discharge portion to be detected, thereby being erroneously recognized as defects on a device in some times. Further, in the SEM-type inspection device, since an extremely high electron beam is controlled using some different types of high voltage electrodes, noise caused by discharges or noise caused by electromagnetic waves generated from the high voltage electrodes is detected using the detector, thereby being erroneously recognized as defects in some times. Since the noise may always occur at random times even on the sample or under the apparatus conditions as described above, it is difficult to determine differences between usual defects and the noise. Therefore, it is very difficult to automatically classify defects as erroneous recognition of the defects only from information of images. Accordingly, an object of the present invention is to provide a semiconductor device inspection apparatus capable of obtaining an image in which the noise caused by the discharge generated on the sample or in the apparatus is removed from the signal.

In view of the foregoing, it is an object of the present invention to provide an apparatus for disposing a sub detector for detecting the noise in addition to a main detector for detecting the signal, and for improving the detection performance of defects using a function of subtracting the noise from the signal. That is, the above-described object of the present invention can be achieved by the following constitution.

(1) A semiconductor device inspection apparatus having a noise subtraction system, comprising:

an electron gun for discharging an electron beam;

a stage for holding a sample;

a main detector for detecting a signal discharged due to an electron beam irradiated to the sample; and at least one sub detector for detecting noise generated from the sample or from the apparatus including the sample, wherein:

the sub detector is constituted by an antenna; and the noise subtraction system subtracts noise detected by the sub detector from a signal detected by the main detector to remove or reduce the noise from the signal.

(2) The semiconductor device inspection apparatus according to claim 1, wherein the noise subtraction system has:

an image display unit for displaying a signal image and noise image formed based on each of the signal detected by the main detector and the noise detected by the sub detector; and a subtraction image processor for subjecting the signal image and the noise image to a subtraction processing to obtain an image removed noises.

(3) The semiconductor device inspection apparatus according to claim 1, wherein the noise subtraction system has:

a signal processor for inputting the signal detected by the main detector and the noise detected by the sub detector to a subtraction analog circuit to subtract the noise from the signal; and a subtraction image display unit for displaying an image removed noises based on a signal outputted from the signal processor.

(4) The semiconductor device inspection apparatus according to claim 2 or 3, wherein
the noise subtraction system has a function of adjusting a noise amount to be subtracted.
(5) The semiconductor device inspection apparatus according to claim 2, wherein:
the noise subtraction system has a display device including the image display unit; and
the display device has a subtraction adjustment section capable of adjusting the noise amount to be subtracted on the display device.
(6) A semiconductor device inspection apparatus comprising a noise subtraction system, comprising:
an electron gun for discharging an electron beam;
a stage for holding a sample;
a main detector for detecting a signal discharged due to an electron beam irradiated to the sample; and
at least one sub detector for detecting noise generated from the sample or from the apparatus including the sample, wherein:
each of the main detector and the sub detector is constituted by a solid state detector; and
the noise subtraction system subtracts noise detected by the sub detector from a signal detected by the main detector to remove or reduce the noise from the signal.
(7) The semiconductor device inspection apparatus according to claim 6, wherein
the noise subtraction system has:
an image display unit for displaying a signal image and noise image formed based on each of the signal detected by the main detector and the noise detected by the sub detector; and
a subtraction image processor for subjecting the signal image and the noise image to a subtraction processing to obtain an image removed noises.
(8) The semiconductor device inspection apparatus according to claim 7, wherein
the noise subtraction system has a function of adjusting the noise amount to be subtracted.
(9) The semiconductor device inspection apparatus according to claim 7, wherein
the noise subtraction system has a display device including the image display unit; and
the display device has a subtraction adjustment section capable of adjusting the noise amount to be subtracted on the display device.

According to the present invention, there can be obtained an image in which the noise caused by discharge generated on the sample or in the apparatus is removed from the signal.

Other objects, features and advantages of the invention will become apparent from the following description of the embodiments of the invention taken in conjunction with the accompanying drawings.

DETAILED DESCRIPTION OF THE INVENTION

Preferred embodiments according to the present invention will be described in detail below with reference to the figures.

First Embodiment

Figure 1:
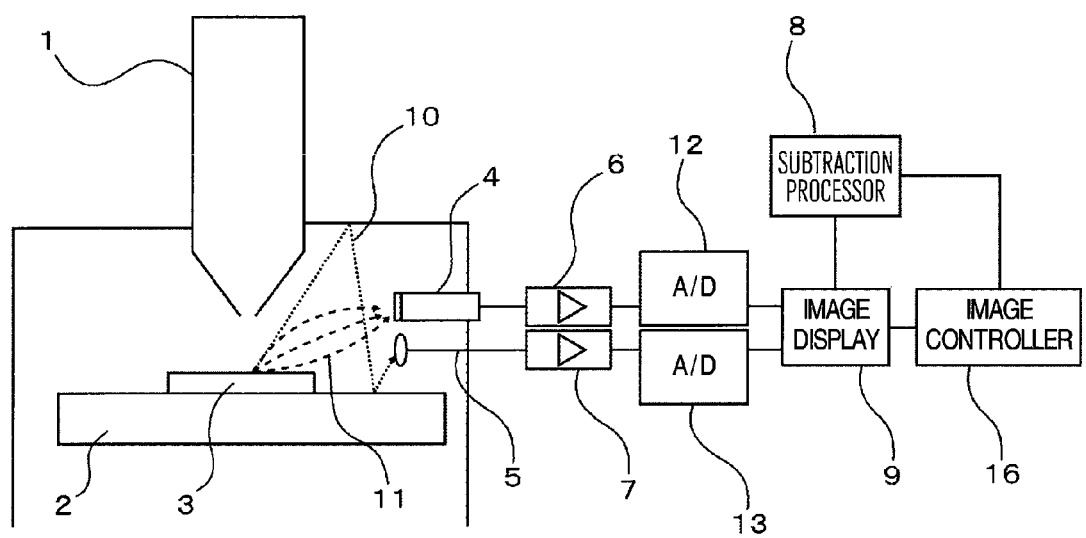
FIG. 1 is a schematic diagram of an apparatus of the present invention capable of reducing noises.

Noise reduction using an antenna for detecting an electromagnetic wave will be described below. As shown in FIG. 1, in addition to a main detector 4 for detecting a main signal 11 discharged from a sample 3, an antenna 5 for detecting electromagnetic noise 10 is disposed. The main signal 11 discharged from the sample 3 is detected by the main detector 4, while the electromagnetic wave 10 caused by local discharge in the sample 3 is detected as noise by the antenna 5. Next, the detected signal is amplified using a signal amplifier 6 and the detected noise is amplified using a noise amplifier 7, respectively. Next, the amplified signal and noise are analog-to-digital converted by analog/digital (hereinafter, denoted as A/D) converters 12 and 13.

Figure 2:
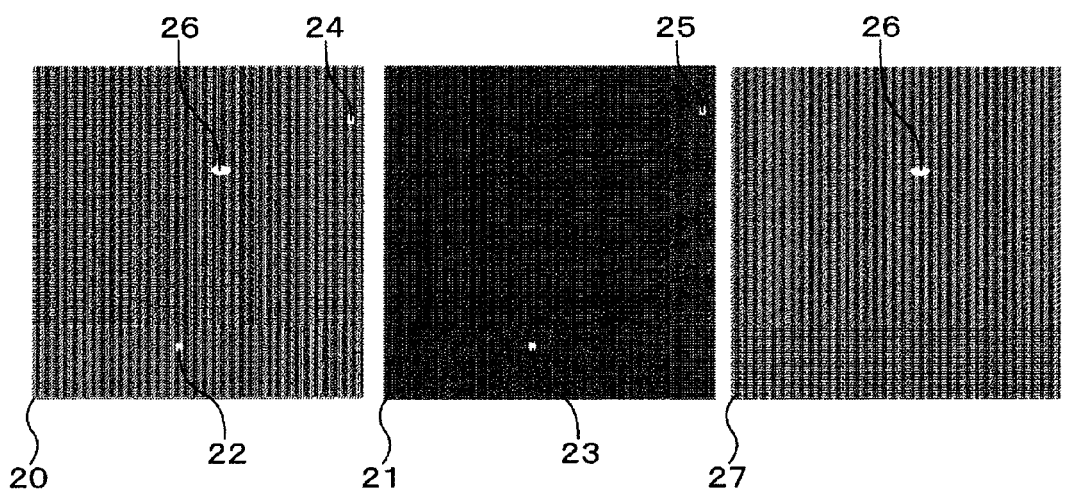
FIG. 2 is a schematic diagram of an image formed by signals, an image formed by noises, and an image obtained by subtracting the noises from the signals of the present invention.

FIG. 2 are diagrams obtained by displaying an image on an image display unit 9 from each of the digital signals. Here, there are shown images obtained by simulating a case where a device on which thin lines are formed at regular intervals is observed. An image 20 is an image formed by the signals, and an image 21 is an image formed by the noises. In the image 20, there is shown an image obtained by simulating a case where noise portions 22 and 24 caused by discharge appear as white luminescent spots on the image along with a true defect 26 on the device. On the other hand, the noise portions 22 and 24 caused by discharge mainly appear on the image 21 formed by the noises detected by the antenna 5.

Subsequently, by a subtraction image processor 8, the image 21 is subtracted from the image 20. As a result, as shown in an image 27, there can be shown an image on which no noise portions 22 and 24 caused by discharge appear. Further, when this image is compared with an image having no defective spot, the inspection on foreign matters or defects can be performed.

Figure 3:
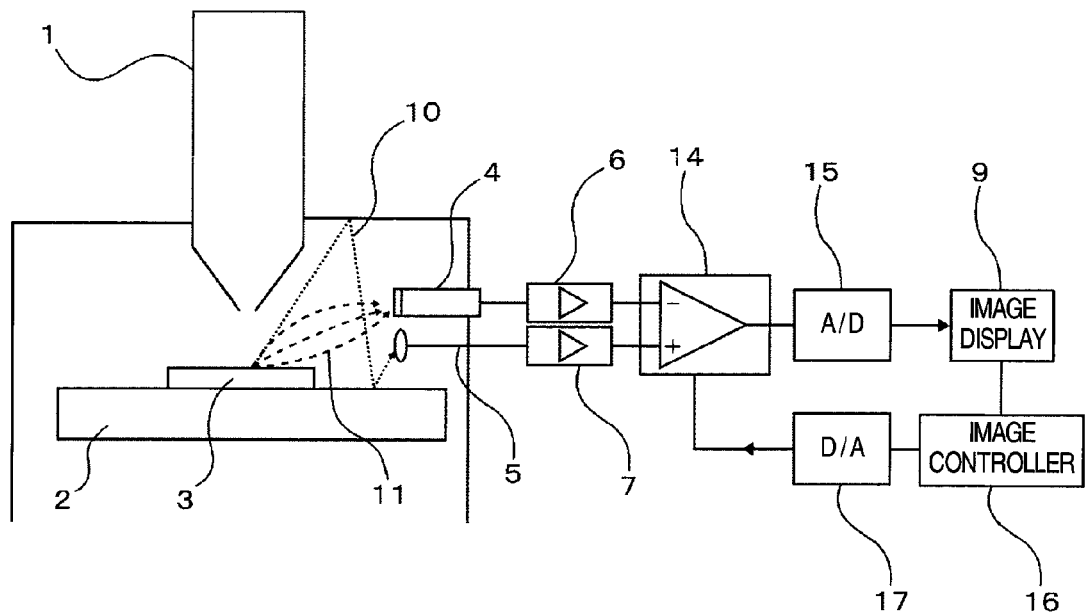
FIG. 3 is a diagram of a detection control circuit system of the present invention having a subtraction function using an analog circuit.

Further, as shown in FIG. 3, during a period until the image is formed, a constitution in which a detector circuit having a function of subtracting the noise from the signal is disposed is also enabled. Hereinafter, a subtraction method using the detector circuit having a subtraction function will be described.

First, the main signal 11 discharged from the sample 3 is detected by the main detector 4, while the electromagnetic wave 10 caused by local discharge in the sample 3 is detected as the noise by the antenna 5. Next, the detected signal is amplified using the signal amplifier 6 and the detected noise is amplified using the noise amplifier 7, respectively. Thus far, a constitution in FIG. 3 is the same as that in FIG. 1. Then, the noise after the amplification by the noise amplifier 7 is analogously subtracted by a subtraction analog circuit 14 from the signal after the amplification by the signal amplifier 6. The subtracted signal is analog-to-digital converted by the A/D converter 15, and then the image is displayed, whereby only an image removed noises can be displayed on the image. In this case, the subtraction image processor 8 is not required. When the subtraction amount is adjusted, the subtraction amount via a digital/analog (hereinafter, denoted as D/A) converter 17 is analogously adjusted to thereby realize the adjustment.

Second Embodiment

To detect a signal or noise formed by electrons, a solid state detector or photo-multiplier can be used as a detecting section. Here, a method of detecting the signal or noise using the solid state detector will be described. In addition, since the solid state detector can detect not only an electron but also an X-ray and excitation light, the following method and apparatus constitution are the same as in a case of the noise formed by electrons also when the noise is formed by X-rays and excitation light.

Figure 4:
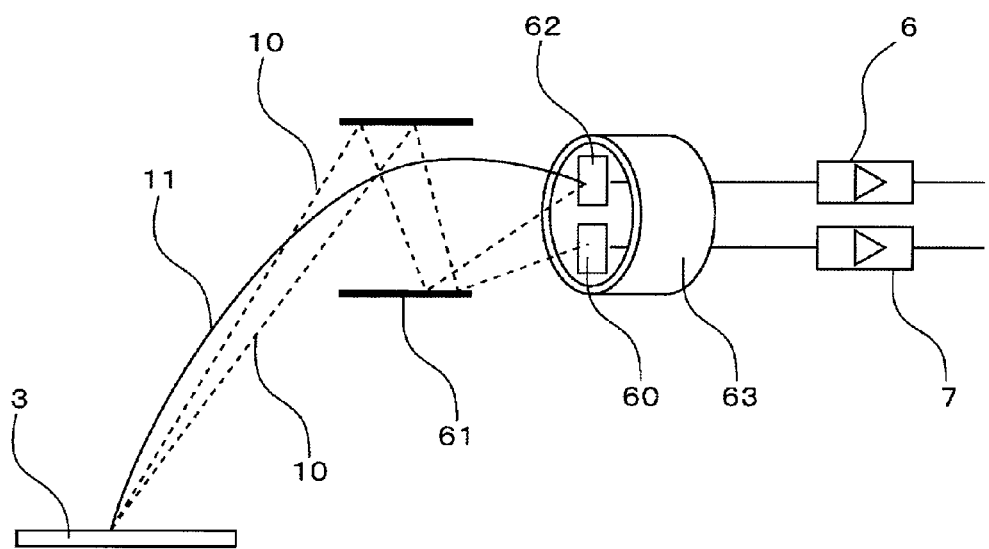
FIG. 4 is a diagram of a detection system of the present invention for explaining detection of the signals and noises by bringing a solid state detector for detecting the signals into close contact with that for detecting the noises.

As shown in FIG. 4, at least two or more solid state detectors are disposed to thereby realize the apparatus constitution. Control of the electron beam orbit is performed using an electron lens 61 such that the main signal 11 discharged from the sample enters into the solid state detector 62 for detecting the signal. Thereby, the main signal 11 can be detected. In FIG. 4, the electron lens 61 is disposed apart from the detector 63; however, by applying a high voltage to the detector 63 itself, electrons can be also converged while attracting electrons discharged from the sample 3 to the detector 63. The main signal 11 is detected by the solid state detector 62 for detecting the signal. On the other hand, since electrons with high-energy discharged from the sample 3 or electrons caused by the discharge of high voltage electrodes move on an electron beam orbit not foreseen in designing of the orbit, the detection is performed by both the detectors. Specifically, only the noise is detected using the solid state detector 60 for detecting the noise. Relating to a method and an apparatus constitution for subtracting the noise from the detected signal, figures of the present embodiment are the same as FIGS. 1 to 3.

Further, when solid state detectors can be used as the detector 4 for detecting the signal and the electron beam detector 60 for detecting the noise, the detectors can be brought into close contact with each other as shown in FIG. 4. In this case, it becomes difficult to design the electron beam orbit for entering the signal discharged from the sample 3 into the main detector 4; however, since a slight deviation of the orbit can be detected, the noise can be effectively obtained.

Third Embodiment

Hereinafter, a method and a function for adjusting the subtraction amount will be described. Depending on the apparatus, sample or inspection conditions, it is different as to how much noise is generated. For example, when the inspection is performed by irradiating a large-current electron beam to an easily charged wafer, chances of the fine discharge become high.

Figure 5:
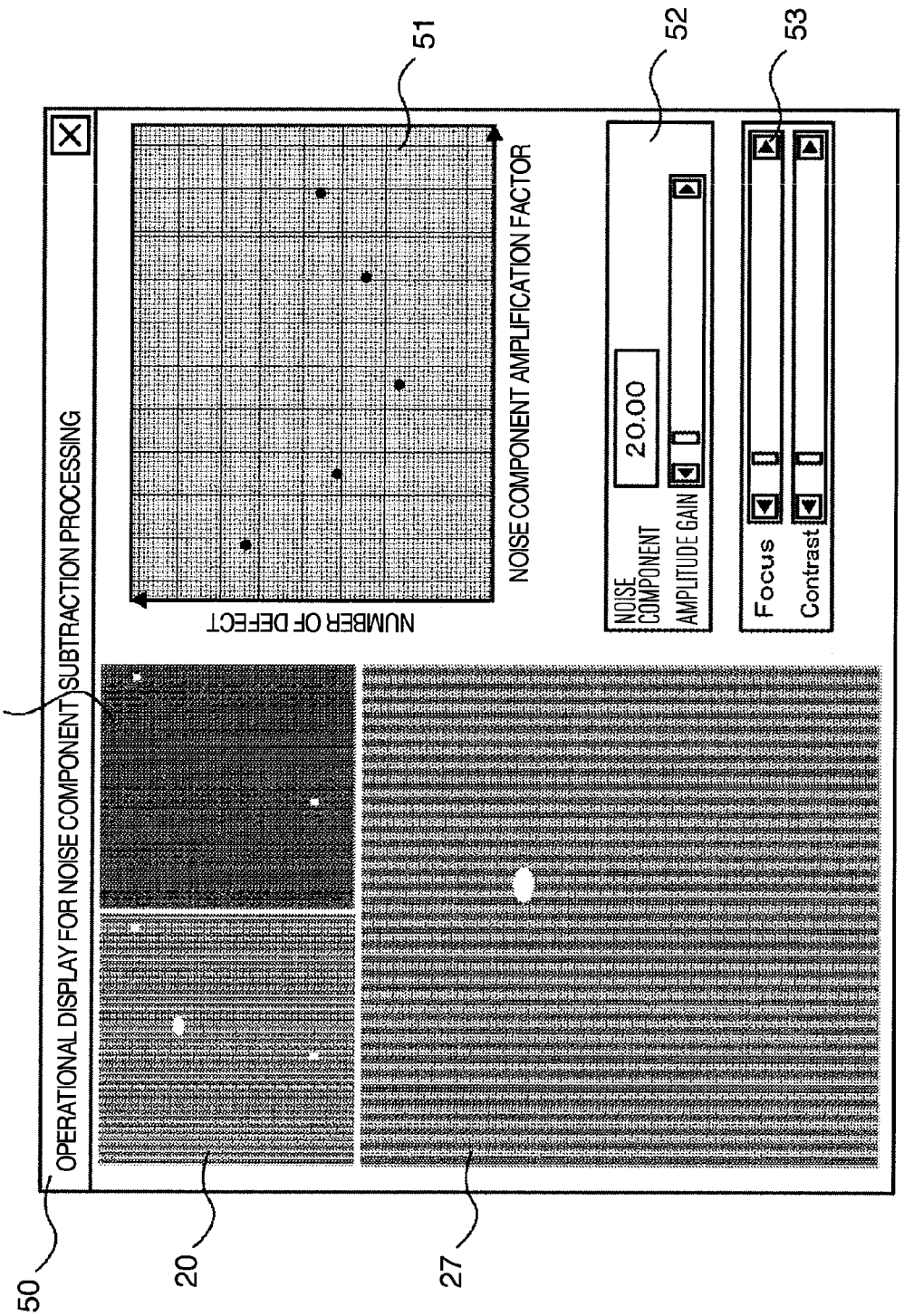
FIG. 5 is a schematic diagram of a display device of the present invention, in which the subtraction amount of the noises is adjusted and the adjustment result is displayed.

When the subtraction amount is too large or too small, it is considered that the noise is still erroneously recognized as a defect. Therefore, the function capable of adjusting the subtraction amount is required. To solve the above problem, when the noise is subtracted from the signal, a subtraction adjustment section 52 capable of adjusting the subtraction amount on a display device must be provided as shown in FIG. 5 so that the subtraction amount can be adjusted. The optimal subtraction amount can be found using the subtraction amount adjustment function.

The optimal adjustment amount can be found by the following procedure. First, the subtraction adjustment amount is changed several times to perform an experimental inspection to thereby obtain the number of detection defects, respectively. Next, there is prepared a graph 51 or numerical value table indicating a relationship between the subtraction adjustment amount changed several times and the number of detection defects of that time. It can be determined conditions in the subtraction adjustment amount of the minimal number of detection defects in the graph or table. As a result, the optimal subtraction adjustment amount can be found out. In the subtraction adjustment method, since the simple subtraction amount is changed to be simply tested, full automation of this adjustment can be also realized.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device inspection apparatus having a noise subtraction system, comprising:
    an electron gun for discharging an electron beam;
    a stage for holding a sample;
    a main detector for detecting a signal discharged due to an electron beam irradiated to the sample; and
    at least one sub detector for detecting noise generated from the sample or from the apparatus including the sample, wherein:
    the sub detector is constituted by an antenna; and
    the noise subtraction system subtracts noise detected by the sub detector from a signal detected by the main detector to remove or reduce the noise from the signal.

2. The semiconductor device inspection apparatus according to claim 1, wherein
    the noise subtraction system has:
    an image display unit for displaying a signal image and noise image formed based on each of the signal detected by the main detector and the noise detected by the sub detector; and
    a subtraction image processor for subjecting the signal image and the noise image to a subtraction processing to obtain an image removed noises.

3. The semiconductor device inspection apparatus according to claim 1, wherein
    the noise subtraction system has:
    a signal processor for inputting the signal detected by the main detector and the noise detected by the sub detector to a subtraction analog circuit to subtract the noise from the signal; and
    a subtraction image display unit for displaying an image removed noises based on a signal outputted from the signal processor.

4. The semiconductor device inspection apparatus according to claim 2, wherein
    the noise subtraction system has a function of adjusting a noise amount to be subtracted.

5. The semiconductor device inspection apparatus according to claim 2, wherein:
    the noise subtraction system has a display device including the image display unit; and
    the display device has a subtraction adjustment section capable of adjusting the noise amount to be subtracted on the display device.

* * * * *